(12) United States Patent
Jonsson et al.

(10) Patent No.: US 7,405,681 B2
(45) Date of Patent: Jul. 29, 2008

(54) A/D CONVERTER CALIBRATION TEST SEQUENCE INSERTION

(75) Inventors: Bengt Erik Jonsson, Spånga (SE); Christer Alf Jansson, Linköping (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 63 days.

(21) Appl. No.: 10/468,234

(22) PCT Filed: Feb. 8, 2002

(86) PCT No.: PCT/SE02/00220

§ 371 (c)(1),
(2), (4) Date: Aug. 18, 2003

(87) PCT Pub. No.: WO02/069581

PCT Pub. Date: Sep. 6, 2002

(65) Prior Publication Data

US 2004/0075599 A1    Apr. 22, 2004

(30) Foreign Application Priority Data

Feb. 27, 2001    (SE) .................................... 0100663

(51) Int. Cl.
*H03M 1/10*    (2006.01)
(52) U.S. Cl. ....................... 341/120; 341/118
(58) Field of Classification Search ......... 341/118–155, 341/156, 175, 172, 161
See application file for complete search history.

(56) References Cited

U.S. PATENT DOCUMENTS

| 5,416,485 | A | | 5/1995 | Lee |
| 5,499,027 | A | * | 3/1996 | Karanicolas et al. ........ 341/120 |
| 5,861,828 | A | * | 1/1999 | Opris .......................... 341/120 |
| 5,990,814 | A | * | 11/1999 | Croman et al. .............. 341/118 |
| 6,411,233 | B1 | * | 6/2002 | Sutardja ...................... 341/120 |
| 6,621,431 | B2 | * | 9/2003 | Engl et al. ................... 341/120 |
| 6,778,110 | B2 | * | 8/2004 | Jansson ....................... 341/120 |
| 6,894,631 | B1 | * | 5/2005 | Bardsley ..................... 341/120 |
| 2004/0113826 | A1 | * | 6/2004 | Whittaker et al. ........... 341/156 |

FOREIGN PATENT DOCUMENTS

CA    2092666 A1    10/1994

OTHER PUBLICATIONS

International Search Report mailed Jun. 24, 2002 in corresponding PCT application No. PCT/SE02/00020.
International Preliminary Examination Report mailed Jan. 8, 2003 in corresponding PCT Application No. PCT/SE02/00020.
Myung-Jun Choe, Band-Sup Song, Bacrania K., "A 13-b 40-Msamples/s CMOS Pipelined Folding ADC with Background Offset Trimming", IEEE Journal of Solid-State Circuits, vol. 35, No. 12, Dec. 2000, pp. 1781-1790.
Song-Ung Kwak & Bang-Sup Song, "A 15-b, 5Msample/s Low-Spurious CMOS ADC", IEEE Journal of Solid-State Circuits, vol. 32, No. 12, Dec. 1997.

* cited by examiner

*Primary Examiner*—Lam T. Mai
(74) *Attorney, Agent, or Firm*—Nixon & Vanderhye, P.C.

(57) ABSTRACT

An A/D converter stage including an A/D sub-converter connected to a D/A sub-converter (12) is calibrated by a method that inserts a calibration test sequence into the D/A sub-converter. This is accomplished by forcing (SW) the comparators (COMP1-COMP7) of the A/D sub-converter to generate and insert the sequence into the D/A sub-converter.

4 Claims, 14 Drawing Sheets

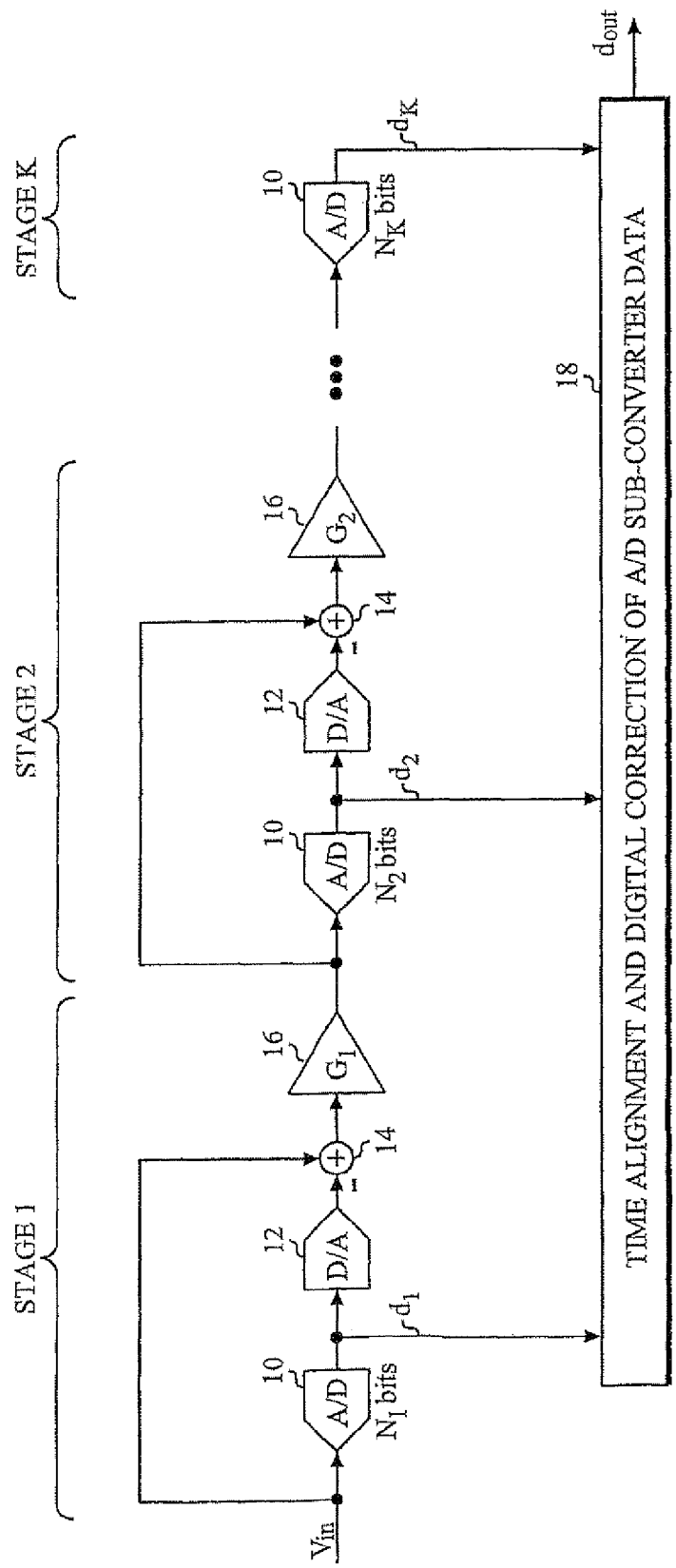
Fig. 1
(CONVENTIONAL)

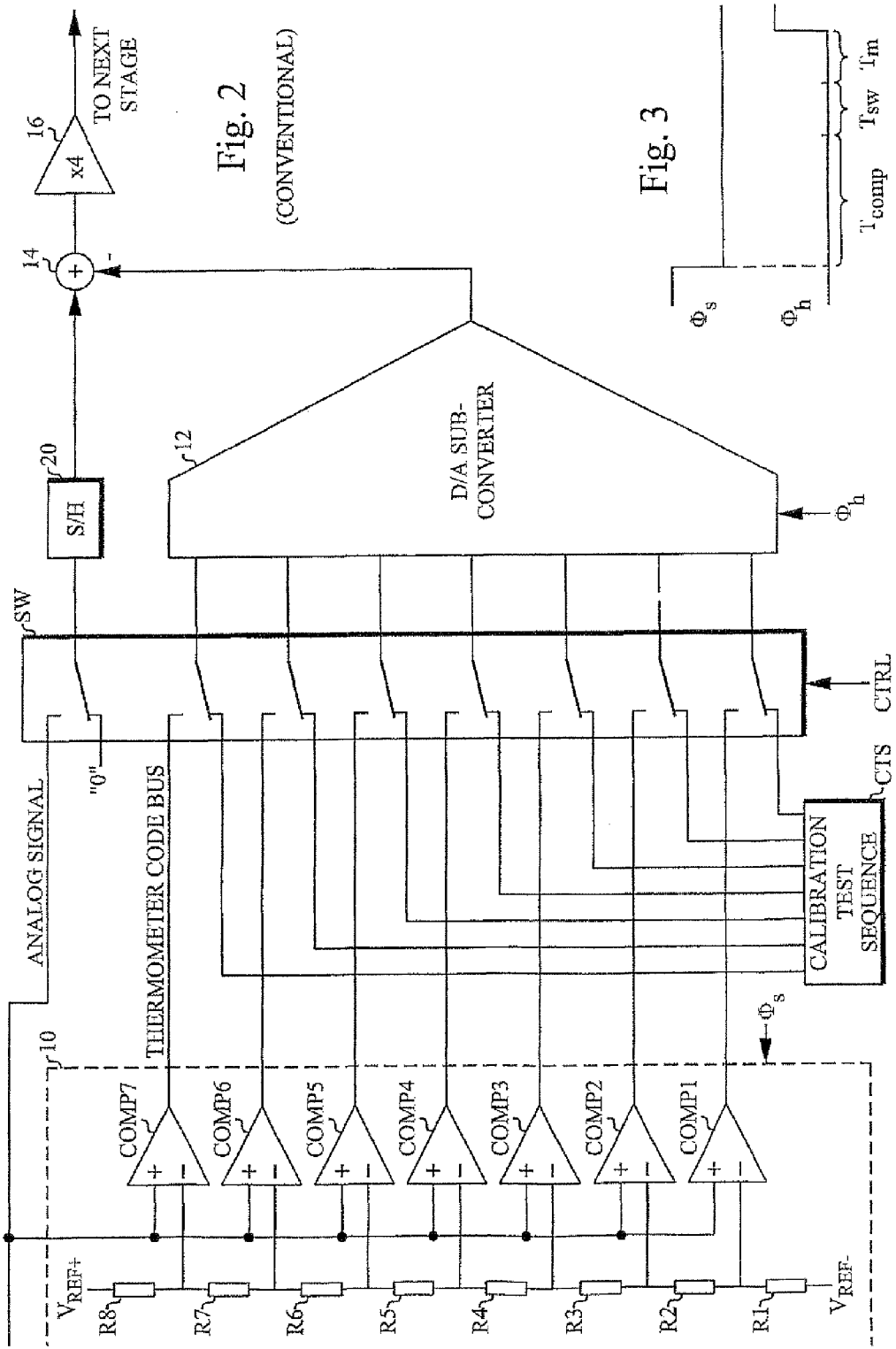

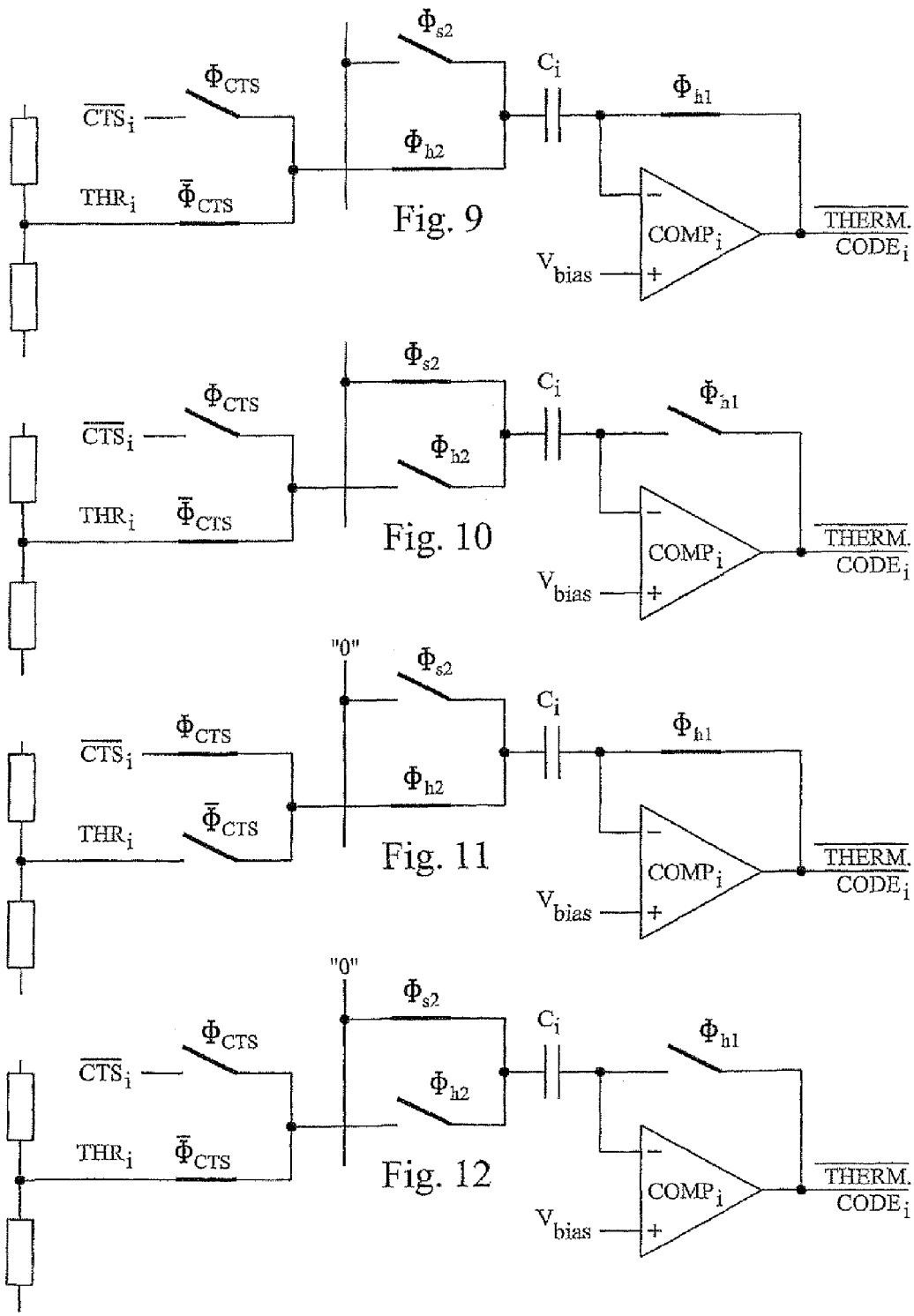

A/D CONVERTER CALIBRATION TEST SEQUENCE INSERTION

This application is the U.S. National phase of international application PCT/SE02/00220 filed 8 Feb. 2002 which designates the U.S.

TECHNICAL FIELD

This invention relates to analog-to-digital converters (A/D converters), and in particular how to insert calibration test sequences in pipeline, sub-ranging and cyclic A/D converters.

BACKGROUND

The maximum achievable accuracy-speed performance of any A/D converter is limited by non-ideal effects associated with its building blocks. Typically, the performance is limited by settling time, finite amplifier gain, and/or component mismatch. When designing high-speed, high-accuracy A/D converters, these limitations impose stringent demands on building blocks, leading to prolonged design time and lower yield.

Many non-ideal effects can be compensated for by using calibration, which relaxes the demands on the building blocks while increasing the overall performance. The trend today is to employ calibration which operates on the digital output of the A/D converter, since digital signal processing is robust and can be implemented at a low cost due to the scaling of modern CMOS processes. However, the difficulty is often how to accurately acquire calibration coefficients to be used in the calibration algorithm that makes up for the non-ideal effects of the analog components.

A popular and efficient method to determine the calibration coefficients for pipeline, sub-ranging and cyclic A/D converters employs switching of the internal digital-to-analog converter (D/A converter) elements of the stages to be calibrated by specific calibration test sequences to be able to characterize the critical components and extract calibration coefficients, see [1].

To acquire calibration coefficients, the normal digital thermometer code from an A/D sub-converter to the corresponding D/A sub-converters is replaced by the calibration test sequence. By this arrangement, each D/A sub-converter element can be controlled by the calibration circuitry and the response and weight of each D/A sub-converter element can measured by the resolution and accuracy of the succeeding stages. Once the errors from finite gain amplifiers and the D/A sub-converter element mismatches have been captured, they can be removed from the digital output. The calibration procedure usually starts at a certain stage in the pipeline chain and moves forward to the first stage. Thereby the accuracy of the measuring device is increasing as the calibration process proceeds. Ideally, there is no limitation in the achievable accuracy for a pipeline A/D converter with an infinite number of pipeline stages. However, noise, drift, and non-linear behavior will restrict the achievable accuracy in physical implementations. The starting stage of the calibration process is typically the stage where the non-ideal errors become in parity with the quantization error of the later stages used for the measurements. Since the switching of the D/A converter elements is performed at normal clock rate, the internal dynamic behavior is also monitored and errors from imperfect settling are suppressed as well. A similar calibration procedure is used for cyclic converters, but here the data circulates so that the stage that is calibrated is also used for the measurements.

A problem with the described method is that extra logic is required on the time critical thermometer code bus. This results in an extra signal delay, which has a negative impact on the maximal achievable sample rate.

SUMMARY

An object of the present invention is to provide A/D converter calibration based on calibration test sequences, but without this extra signal delay.

This object is achieved in accordance with the attached claims.

Briefly, the present invention inserts the calibration test sequences outside of the thermometer code bus by forcing the comparators of the A/D sub-converter of a stage to produce and insert the calibration test sequence into the D/A sub-converter of the same stage. This eliminates the extra delay on the thermometer code bus, thereby increasing the attainable sample rate.

BRIEF DESCRIPTION OF THE DRAWINGS

The invention, together with further objects and advantages thereof, may best be understood by making reference to the following description taken together with the accompanying drawings, in which:

FIG. 1 is a block diagram of a typical pipeline A/D converter;

FIG. 2 is a block diagram of a typical stage of the A/D converter in FIG. 1 during the calibration phase;

FIG. 3 is a diagram illustrating timing of essential control signals in the A/D converter stage in FIG. 2;

FIG. 9 illustrates the switch configuration of the comparator input stage of FIG. 7 during a first phase;

FIG. 10 illustrates the switch configuration of the comparator input stage of FIG. 7 during a second phase;

FIG. 11 illustrates the switch configuration of the comparator input stage of FIG. 7 during a third phase;

FIG. 12 illustrates the switch configuration of the comparator input stage of FIG. 7 during a fourth phase;

DETAILED DESCRIPTION

Figures 4, 5:
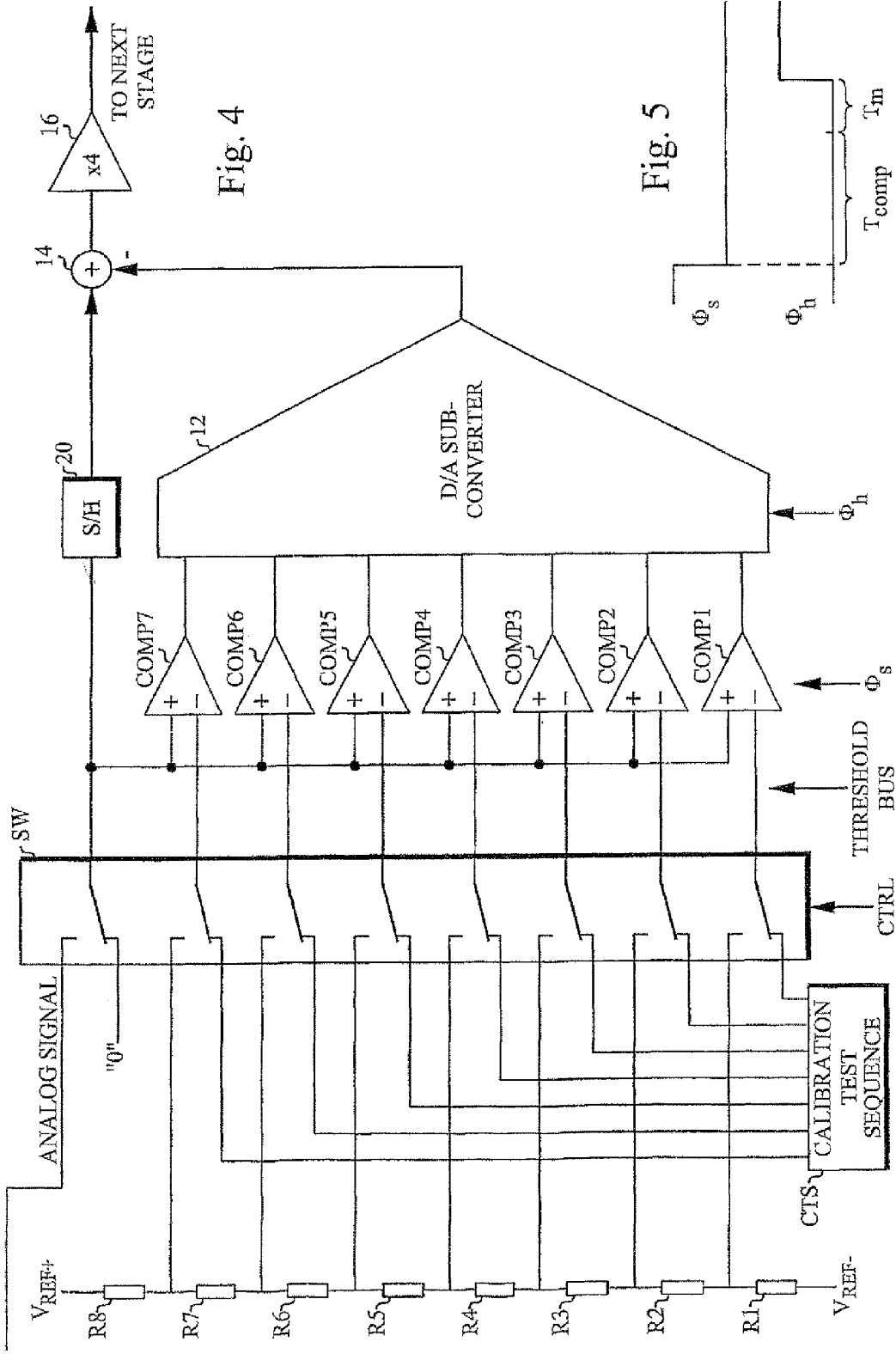
FIG. 4 is a block diagram of an exemplary embodiment of an A/D converter stage in accordance with the present invention during the calibration phase.
FIG. 5 is a diagram illustrating timing of essential control signals in the A/D converter stage in FIG. 4.

In the following description the same reference designations will be used for the same or similar elements.

The description below will describe the present invention with reference to a pipeline A/D converter. However, it is appreciated that the same principles may also be used for other multi-stage A/D converters, such as cyclic or sub-ranging A/D converters.

FIG. 1 is a block diagram of a typical pipeline A/D converter. An N-bit analog-to-digital conversion is performed in two or more stages, each stage extracting $\{N_1, N_2 \ldots N_K\}$ bits of information represented by the digital words $\{d_1, d_2 \ldots d_K\}$, where K is the number of pipeline stages. The first pipeline stage extracts the $N_1$ most significant bits using an $N_1$-bit A/D sub-converter 10. Then the estimated value is subtracted from the analog input signal $V_{in}$ by using a D/A sub-converter 12 and an adder 14, leaving a residue containing the information necessary to extract less significant bits. Usually the residue is amplified by an amplifier 16 having a gain $G_1$ to establish the appropriate signal range for stage 2. These steps are repeated for all K stages, with the exception of the last pipeline stage, which does not need to produce an analog output and therefore has no D/A converter, adder or amplifier, but only an A/D converter 10. The digital words $\{d_1, d_2 \ldots d_K\}$ are then combined to form the digital output word $d_{out}$ in a unit 18 for time alignment and digital correction of A/D sub-converter data.

In order to simplify the following description, it is assumed that an A/D converter stage has a resolution of 3 bits. This number is sufficiently small to be manageable, but is also large enough to illustrate the essential features of a typical case.

FIG. 2 is a block diagram of a typical stage of the A/D converter in FIG. 1 during the calibration phase. A/D sub-converter 10 includes a number of comparators COMP1–COMP7. One input terminal of each comparator is connected to a corresponding reference voltage. These reference voltages are formed by a ladder of resistors R1–R8. During normal A/D conversion the other input terminal of each comparator receives the analog input signal (the same signal to each comparator). The output signals from the comparator collectively form the digitized value in thermometer code. These signals are forwarded to D/A sub-converter 12 over a thermometer code bus, where they are transformed into a corresponding analog value. This value is subtracted from the original analog value (which has been stored in a sample-and-hold circuit 20) in adder 14, and the residual signal is amplified by a gain equal to 4 in gain element 16.

During calibration, an analog signal having a predefined value, for example 0, is forwarded to sample-and-hold circuit 20. However, the corresponding digitized value is not forwarded to D/A sub-converter 12. Instead a set of switches SW disconnect D/A sub-converter 12 from the thermometer code bus and connect it to a sample of the calibration test sequence. This sequence is generated by a calibration test sequence generator CTS. The samples of the calibration test sequence are selected in such a way that different combinations of D/A sub-converter inputs are activated. The resulting analog residual signals are digitized by the remaining stages of the pipeline, and the resulting digital values are used to determine digital calibration coefficients in accordance with well known methods. The calibration sequence may be generated all at once, for example at start-up of the A/D converter, or sample by sample at selected instances where the normal operation of the A/D converter is interrupted.

FIG. 3 is a diagram illustrating the timing of control signals $\Phi_s$ and $\Phi_h$ that control A/D sub-converter 10 and D/A sub-converter 12, respectively, in the A/D converter stage in FIG. 2. The A/D sub-converter decision phase starts when control signal $\Phi_s$ goes down. However, D/A conversion in D/A converter 12 can not start at the same time, due to the delays $T_{comp}$ and $T_{sw}$ introduced by the comparators of A/D sub-converter 10 and switches SW, respectively. Furthermore, there is a safety margin $T_m$ to ensure repetitive settling of the succeeding D/A sub-converter independently of the comparator delays, which are not precisely known. Thus, the total delay before D/A conversion starts by $\Phi_h$ going high is:

$$T_{total\,delay} = T_{comp} + T_{sw} + T_m$$

However, the total delay should be as short as possible, since a shorter delay translates into a higher attainable sample rate. As an example, if $T_{comp}$ is assumed to be 1 ns, $T_{sw}$ and $T_m$ typically are of the order of 0.4 ns.

FIG. 4 is a block diagram of an exemplary embodiment of an A/D converter stage in accordance with the present invention during the calibration phase. In this embodiment switches SW have been moved from the thermometer code bus to the "comparator threshold bus". During calibration the reference voltages to comparators COMP1–COMP7 are replaced by a sample from the calibration test sequence, thereby forcing A/D sub-converter 10 to produce a calibration sample on the thermometer code bus (actually the sample to the comparator threshold bus is inverted, since it is forwarded to the reference inputs and not the signal inputs).

FIG. 5 is a diagram illustrating the timing of control signals $\Phi_s$ and $\Phi_h$ in the A/D converter stage in FIG. 4. Since switches SW have been removed from the thermometer code bus, the total delay on the bus will now be:

$$T_{total\,delay} = T_{comp} + T_m$$

Since the comparators are still present in the converter, the conversion delay $T_{comp}$ will still remain. Using the exemplary delay values above, there is a delay reduction of more than 20%. This reduction may be used to increase the attainable sample rate.

Figure 6:
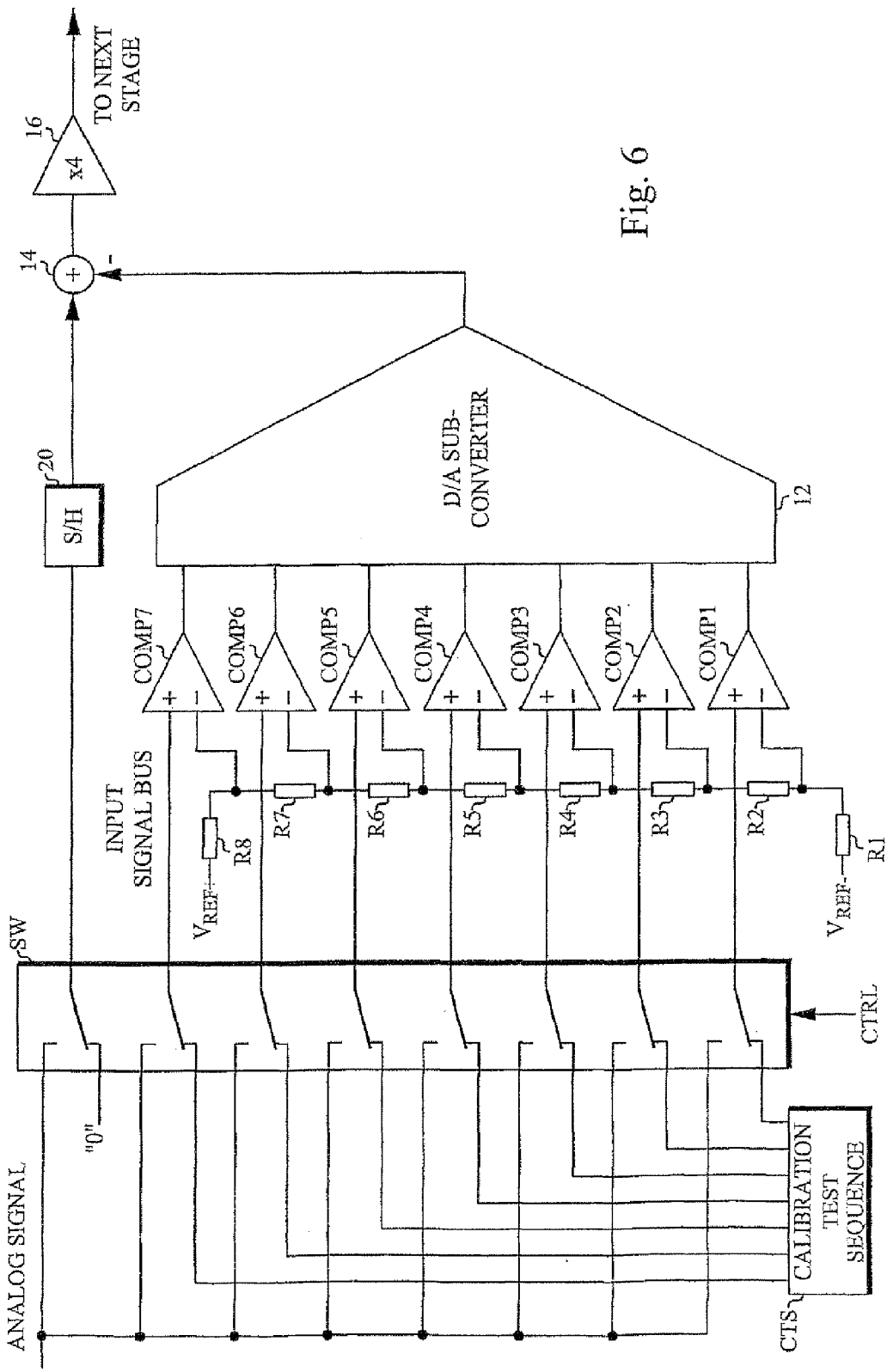
FIG. 6 is a block diagram of another exemplary embodiment of an A/D converter stage in accordance with the present invention during the calibration phase.

FIG. 6 is a block diagram of another exemplary embodiment of an A/D converter stage in accordance with the present invention during the calibration phase. This embodiment is similar to the embodiment of FIG. 4. However, in this case switches SW are connected to the "input signal bus" to A/D sub-converter 10 instead of the comparator threshold bus. This gives the same advantages as the embodiment of FIG. 4.

Figure 7:
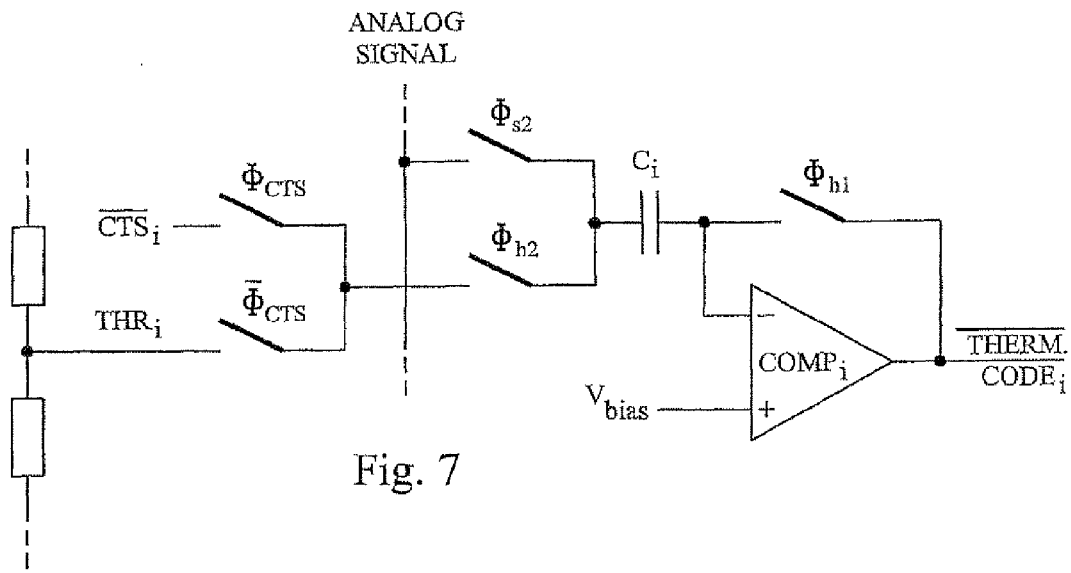
FIG. 7 illustrates an exemplary embodiment of a single-ended comparator input stage.

FIG. 7 illustrates an exemplary embodiment of the i:th comparator input side of an A/D converter stage in accordance with the present invention. It is a single-ended embodiment providing offset suppression by auto-zeroing. This embodiment is based on a comparator $COMP_i$ and a capacitor $C_i$ connected to the inverting terminal, and is controlled by a set of switches, as illustrated by the timing diagram in FIG. 8. In this and the following timing diagrams a high signal level corresponds to a closed (conducting) switch, while a low signal level corresponds to an open (non-conducting) switch.

FIG. 9 illustrates the switch configuration of the comparator input stage of FIG. 7 during a first phase T. During this phase the threshold voltage charges the capacitor. The negative feedback of the comparator establishes the voltage $V_{bias}$ at the inverting comparator input, and the capacitor $C_i$ is thus charged to the voltage $THR_i - V_{bias}$.

FIG. 10 illustrates the switch configuration of the comparator input stage of FIG. 7 during a second phase A. During this phase the analog signal is forwarded to the capacitor and the feedback path is broken. This will add the difference between the threshold $THR_i$ and the analog signal to the voltage $V_{bias}$ at the inverting comparator input. The resulting voltage will be compared to the voltage $V_{bias}$ at the other comparator input at instant A/D in FIG. 8.

This pattern with a threshold phase T and an analog signal phase A is repeated both during normal sampling and during insertion of calibration samples. The difference is that during calibration the threshold is replaced by an inverted calibration test sequence sample. The corresponding switch configurations for phase T and A are illustrated in FIG. 11-12.

Figure 13:
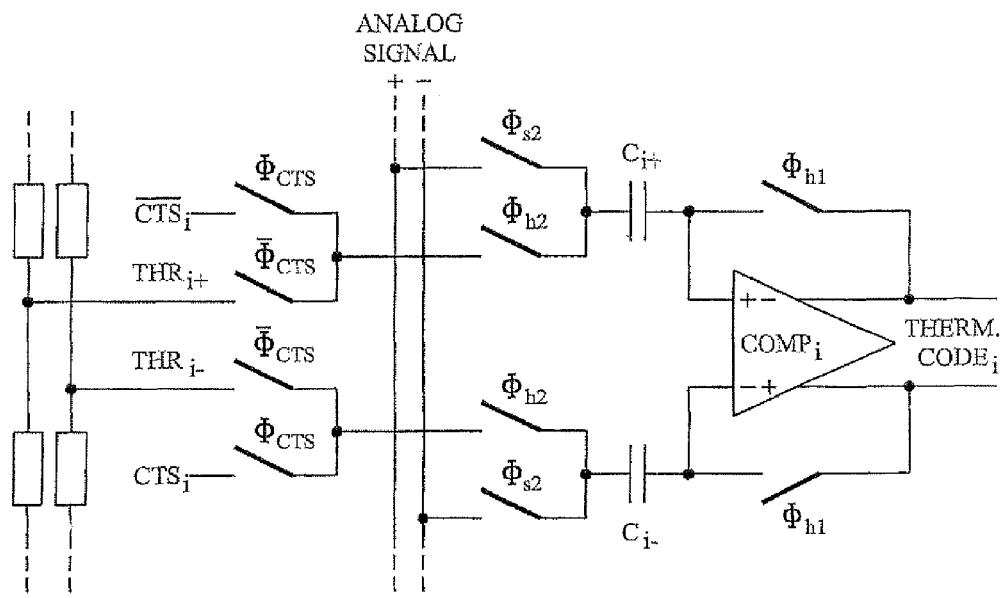
FIG. 13 illustrates an exemplary embodiment of a differential comparator input stage.

FIG. 13 illustrates an exemplary embodiment of a differential comparator input stage. This embodiment corresponds to the single-ended embodiment in FIG. 7.

This circuit is efficient in suppressing common mode voltage differences between reference and input signal sources.

Figure 14:
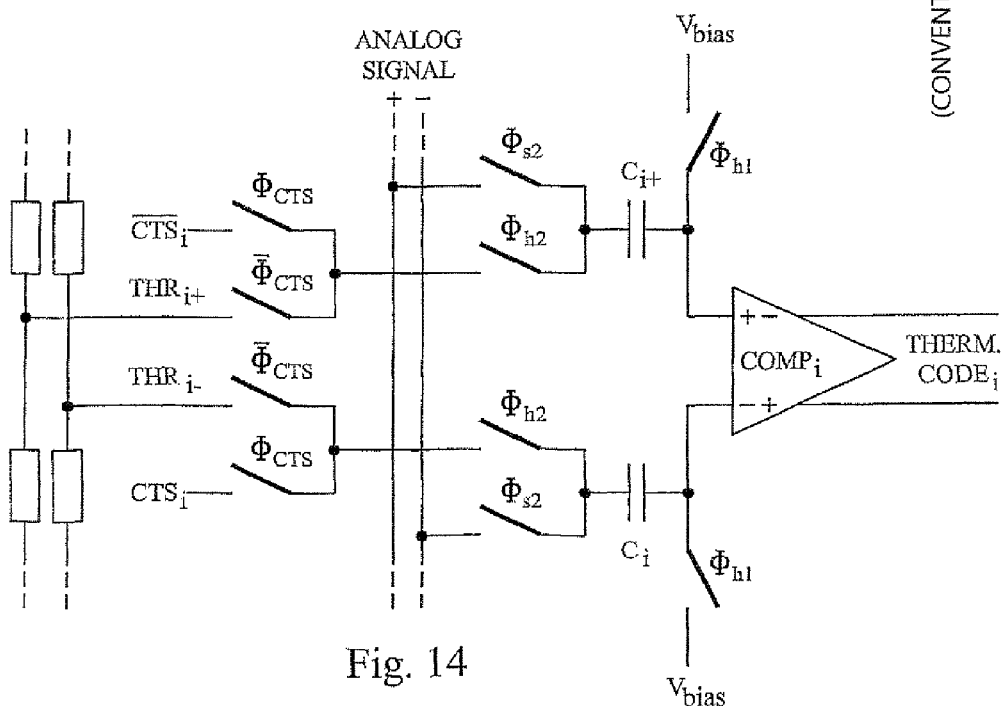
FIG. 14 illustrates another exemplary embodiment of a differential comparator input stage.

FIG. 14 illustrates another exemplary embodiment of a differential comparator input stage. In this case there is no auto-zeroing.

Figure 8:
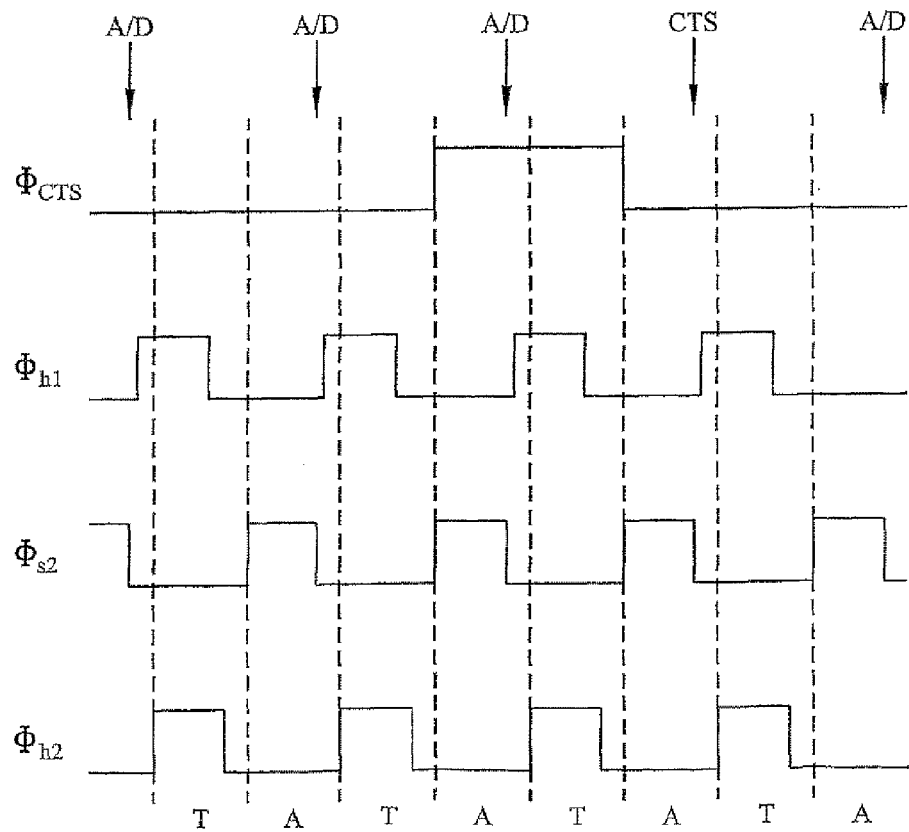
FIG. 8 is a timing diagram for the comparator input stage in FIG. 7.

It is to be noted that the timing diagram in FIG. 8 may be used in the embodiments of FIGS. 13 and 14.

Figure 15:
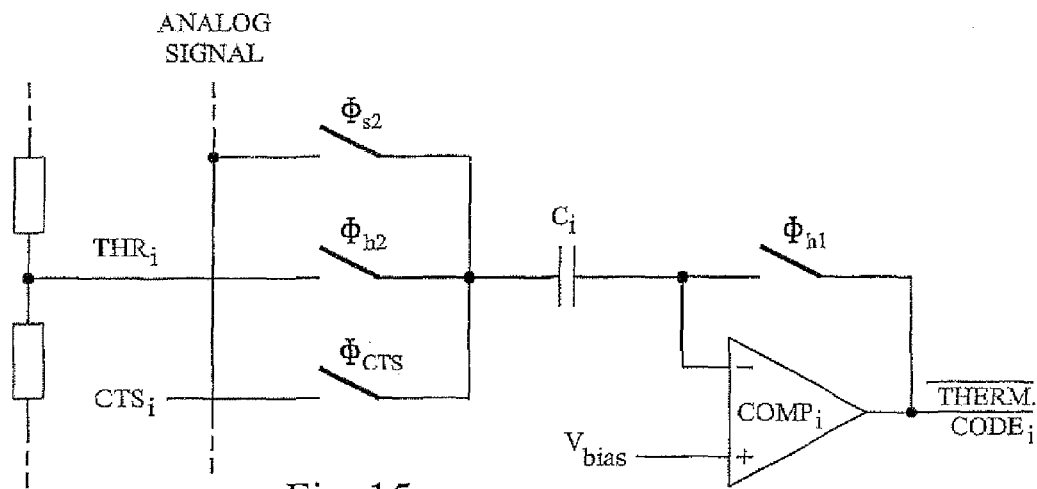
FIG. 15 illustrates another exemplary embodiment of a single-ended comparator input stage.

FIG. 15 illustrates another exemplary embodiment of a single-ended comparator input stage. In this embodiment the switch on the threshold input is replaced by a switch arrangement connected directly to the sampling capacitor. This arrangement has the advantage of avoiding an extra switch (and the corresponding resistance) on the threshold/calibration path to the capacitor. Furthermore, the switches can be made considerably smaller, which improves threshold settling.

Figure 16:
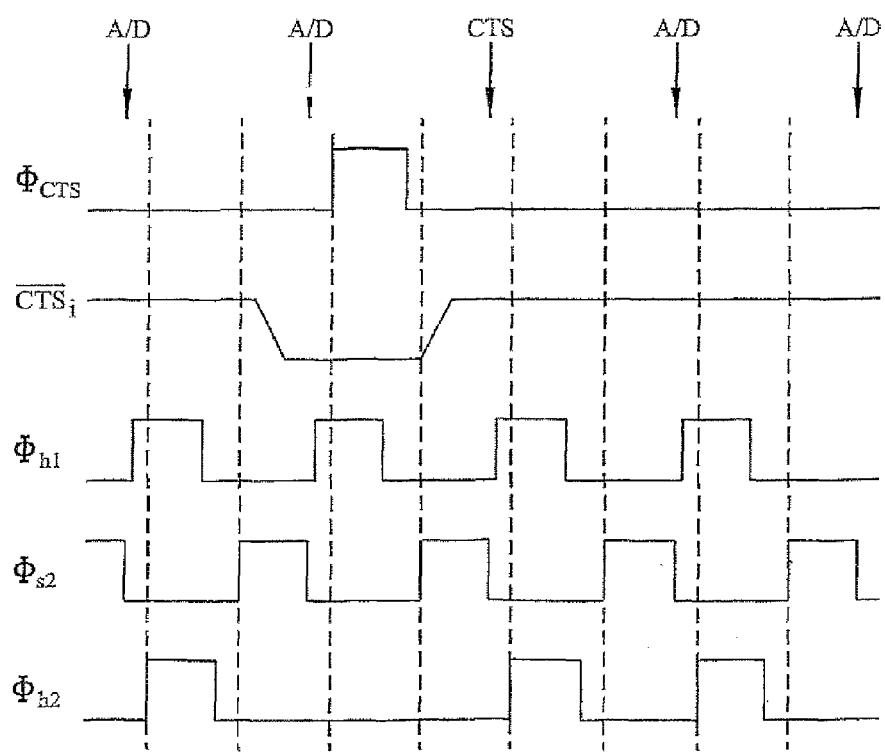
FIG. 16 is a possible timing diagram for the comparator input stage in FIG. 15.
Figure 17:
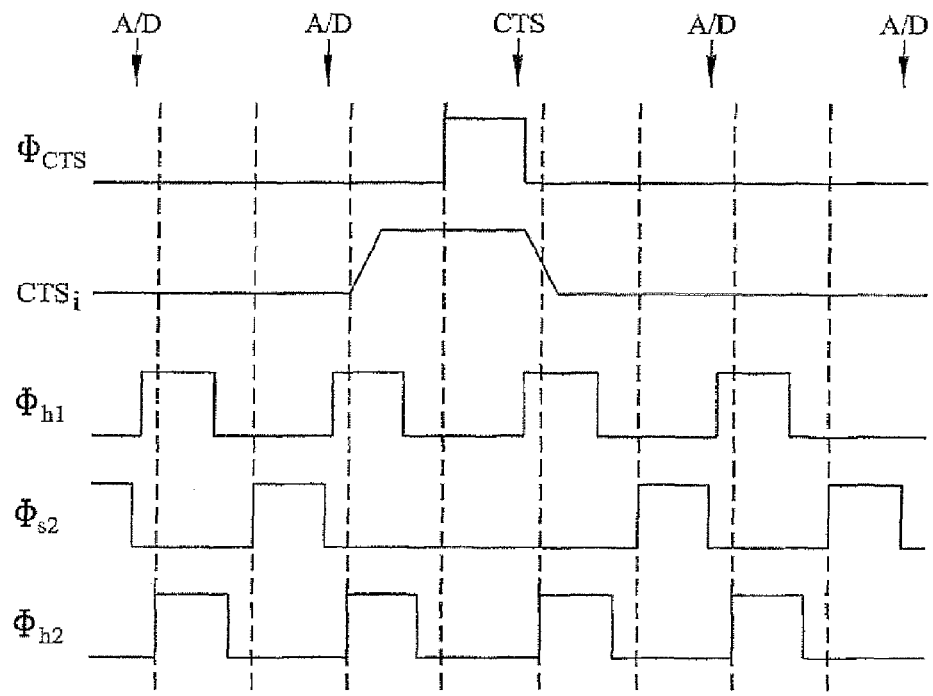
FIG. 17 is another possible timing diagram for the comparator input stage in FIG. 15.
Figure 18:
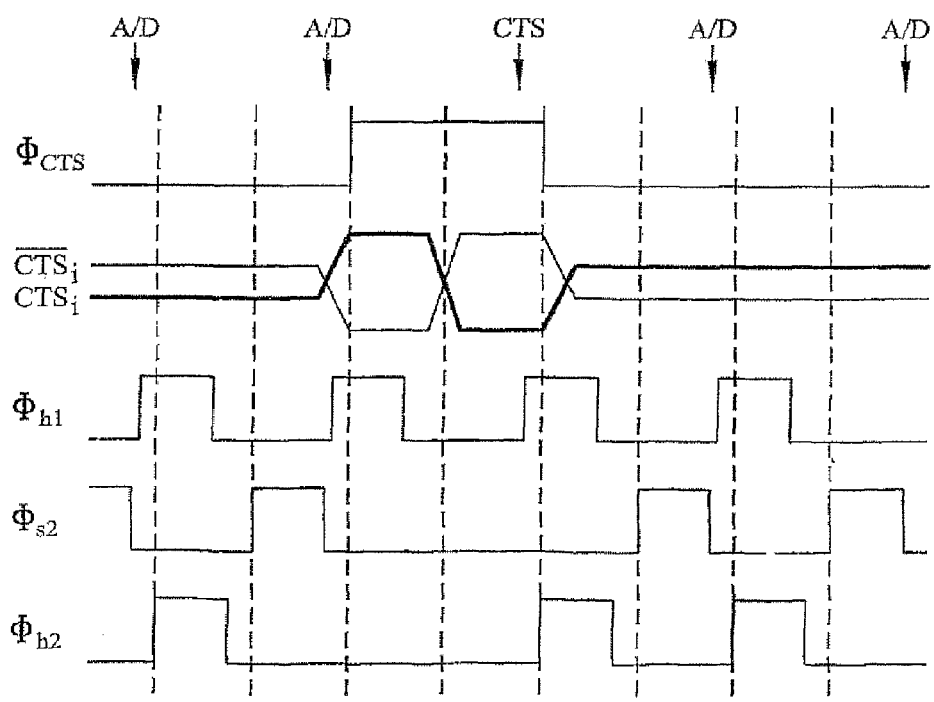
FIG. 18 is a further possible timing diagram for the comparator input stage in FIG. 15.

FIG. 16-18 illustrate 3 possible timing diagrams for the embodiment illustrated in FIG. 15.

FIG. 16 illustrates one possible timing diagram. In this case the (inverted) CTS signal is inserted during the threshold input phase.

FIG. 17 is another possible timing diagram in which the CTS signal is inserted during the analog signal input phase.

FIG. 18 is a further possible timing diagram for the comparator input stage in FIG. 15. In this case the CTS signal is inserted during both phases. This timing scheme has the advantage of requiring only rather low voltage swings and that minimum size CTS switches can be used, since no large input or threshold levels have to be overridden.

Figure 19:
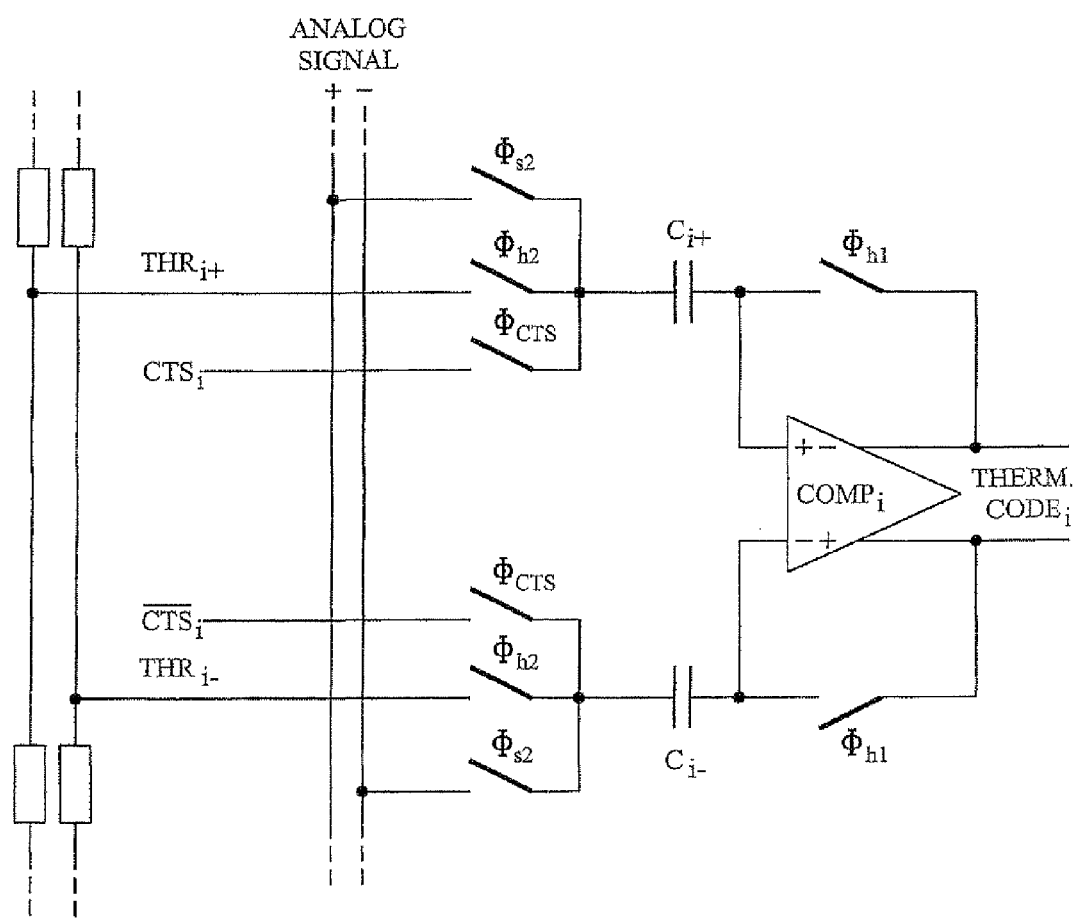
FIG. 19 illustrates an exemplary embodiment of a differential comparator input stage corresponding to the embodiment in FIG. 15.

FIG. 19 illustrates an exemplary embodiment of an auto-zeroing differential comparator input stage corresponding to the embodiment in FIG. 15. The same timing schemes as in FIG. 16-18 may be used for this embodiment. Furthermore, a similar embodiment without auto-zeroing may be obtained by modifying the capacitor arrangement around the comparator as in FIG. 14.

Figure 20:
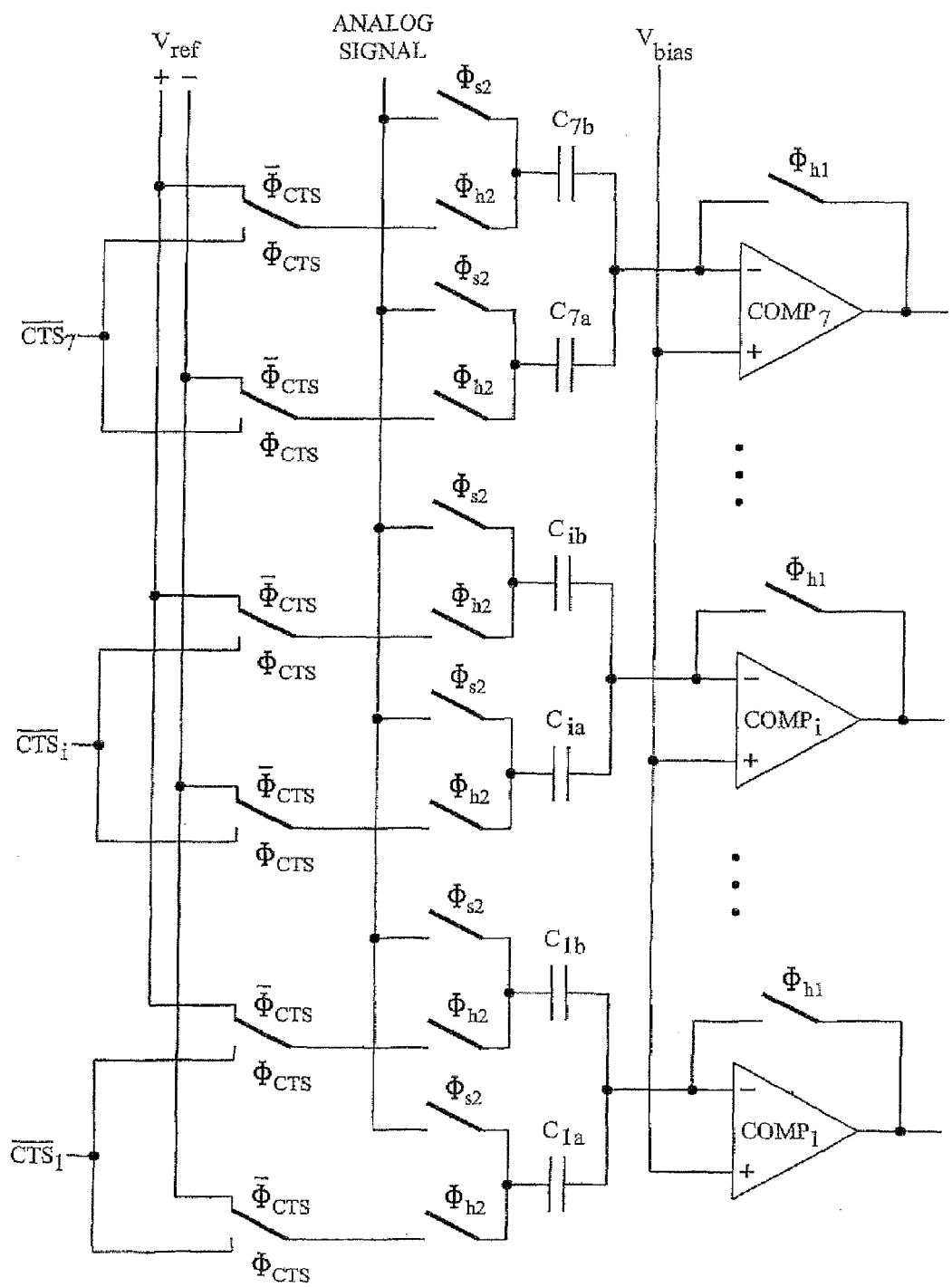
FIG. 20 illustrates an exemplary embodiment of a single-ended switched capacitor implementation of a set of comparator input stages.

FIG. 20 illustrates an exemplary embodiment of a switched capacitor implementation of a set of comparator input stages. The figure illustrates a 3-bit single-ended A/D sub-converter. The sampling switches between the comparator inputs and outputs realize the auto-zeroing function as in some of the previously described embodiments. The threshold levels of the comparators are during normal operation determined by the ratio between the two capacitors at each comparator. These capacitors have the capacitances:

$$C_{ia} = (8-i) \cdot C$$

$$C_{ib} = i \cdot C$$

i=1 ... 7 where C is a common scale factor. At $\Phi_{h2}$ the "b" capacitors are switched to the positive reference voltage and the "a" capacitors are switched to the negative reference voltage. The reference voltages are then sampled at the end of $\Phi_{h1}$, and the total accumulated charge is preserved to the $\Phi_{s2}$ clock phase when all capacitors are switched to the analog signal. The threshold voltages now become available over the parallel connected capacitors by charge sharing, and the comparator decision can be made. If the CTS signals are to be inserted, the CTS control signal selects the corresponding CTS bits instead of the reference voltages at each comparator. If normal switching is maintained, the voltages of the CTS bits must supercede the reference voltage levels to safely override the analog signal input voltage range. The same switching scheme as in FIG. 8 may be used.

Figure 21:
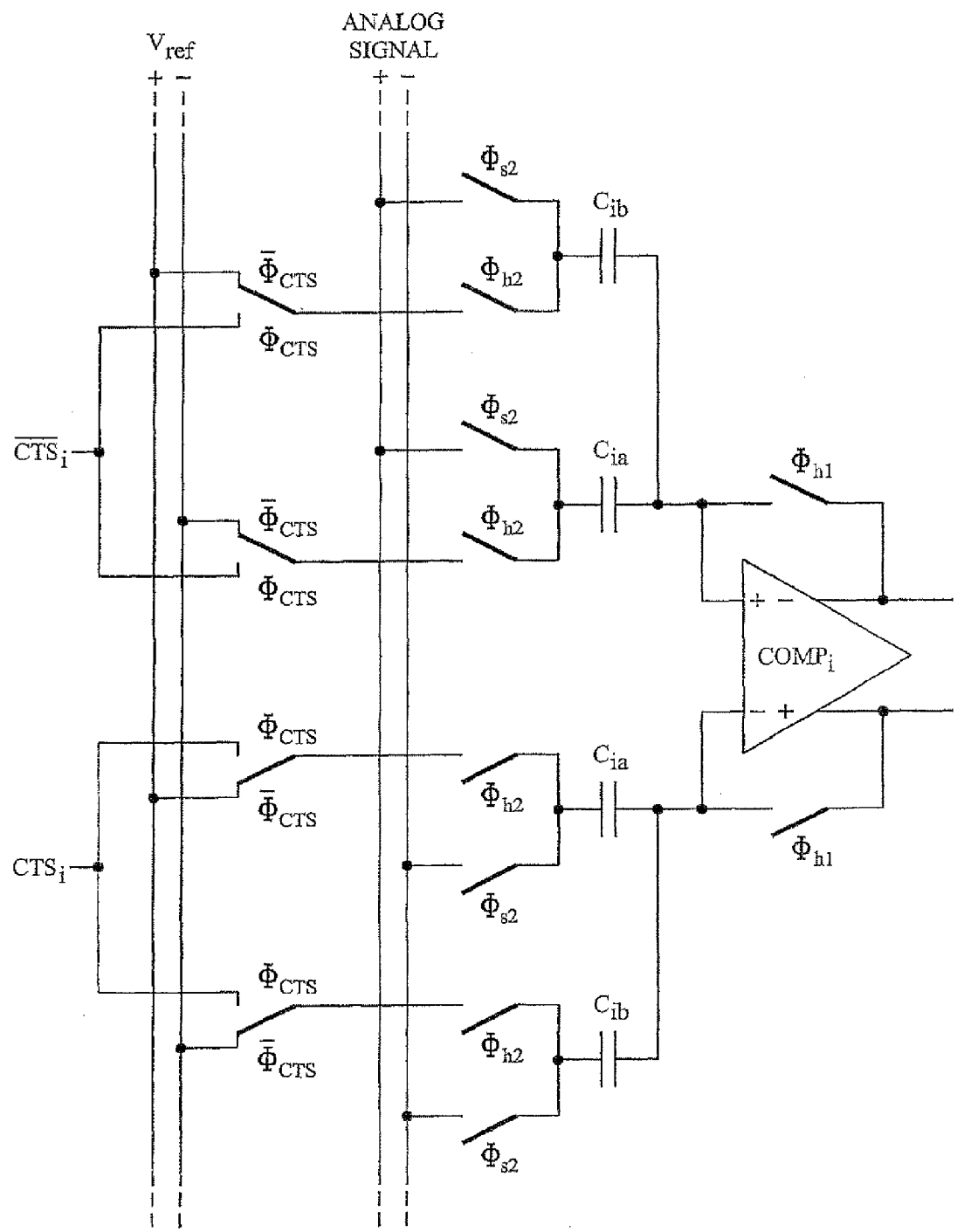
FIG. 21 illustrates an exemplary embodiment of a differential comparator input stage corresponding to the embodiment in FIG. 20.

FIG. 21 illustrates an exemplary embodiment of a differential comparator input stage corresponding to the embodiment in FIG. 20. To avoid overloading of the figure with details, only a generic comparator input stage is illustrated.

It is also possible to modify the embodiments of FIGS. 20 and 21 to avoid the extra switch, as in the embodiments of FIGS. 15 and 19. Such modified embodiments may use the switching schemes of FIG. 16-18.

Figure 22:
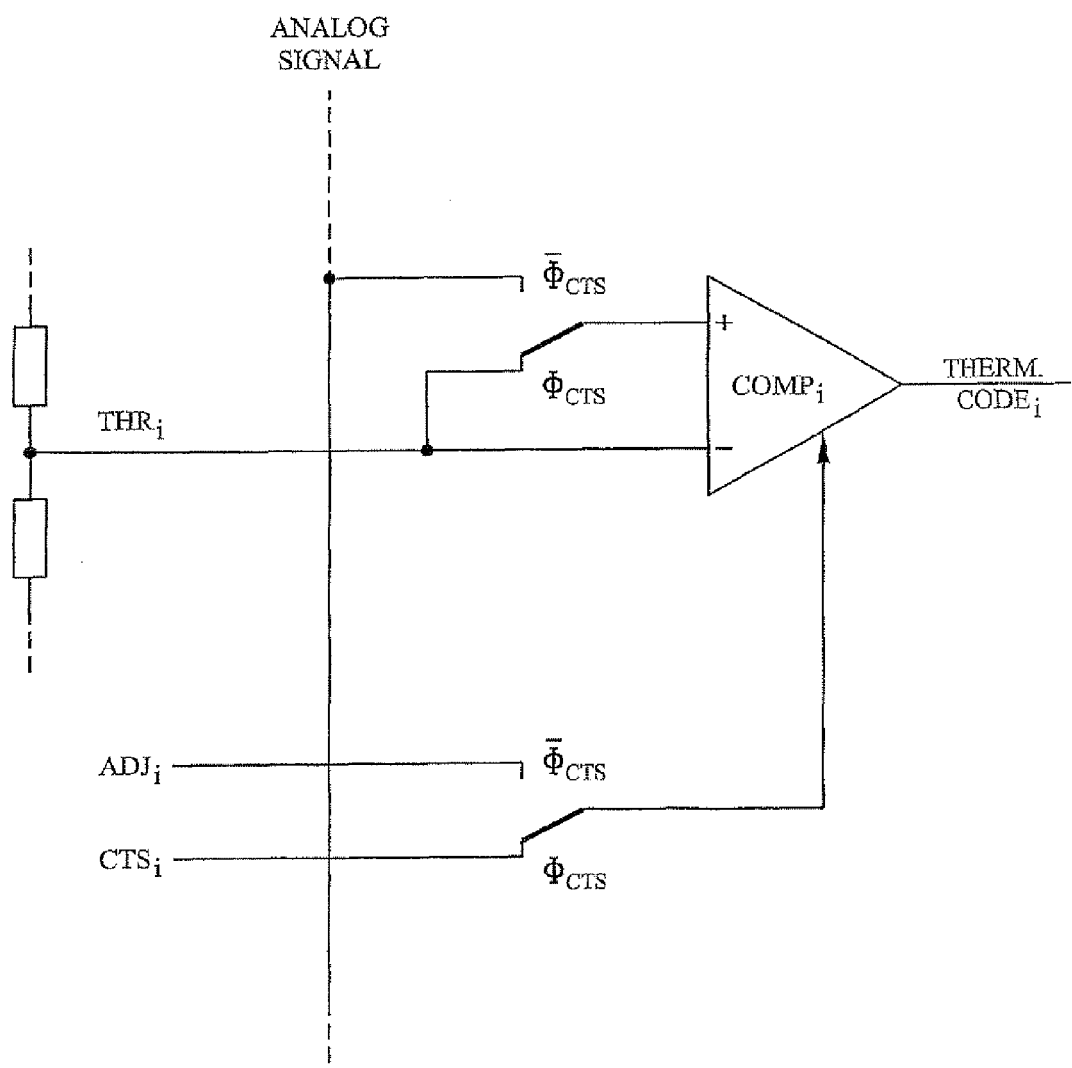
FIG. 22 illustrates another exemplary embodiment of a comparator input stage.

FIG. 22 illustrates another exemplary embodiment of a comparator input stage. This embodiment uses comparator circuits with an extra input for offset adjustment. This extra input can be used to apply the calibration test sequence while the input signal is set to zero. When $\Phi_{CTS}$ is low, the adjustment voltage is fed to the extra comparator input in order to nullify the comparator offset. During this phase the positive comparator input will be connected to the analog input signal and the negative comparator input will be connected to the threshold voltage $THR_i$. During this phase the comparator operates normally. In the other phase, when $\Phi_{CTS}$ is high, both the positive and negative comparator inputs are connected to the threshold voltage, which leads to a zero input. At the same time the large swing CTS signal is applied to the comparator offset adjustment input, thereby overriding the internal offset and thus forcing the comparator output to adopt the CTS signal value. In this embodiment it must be ensured that the gain of the extra input to the output is sufficient to guarantee overriding of the entire offset signal range.

Figure 23:
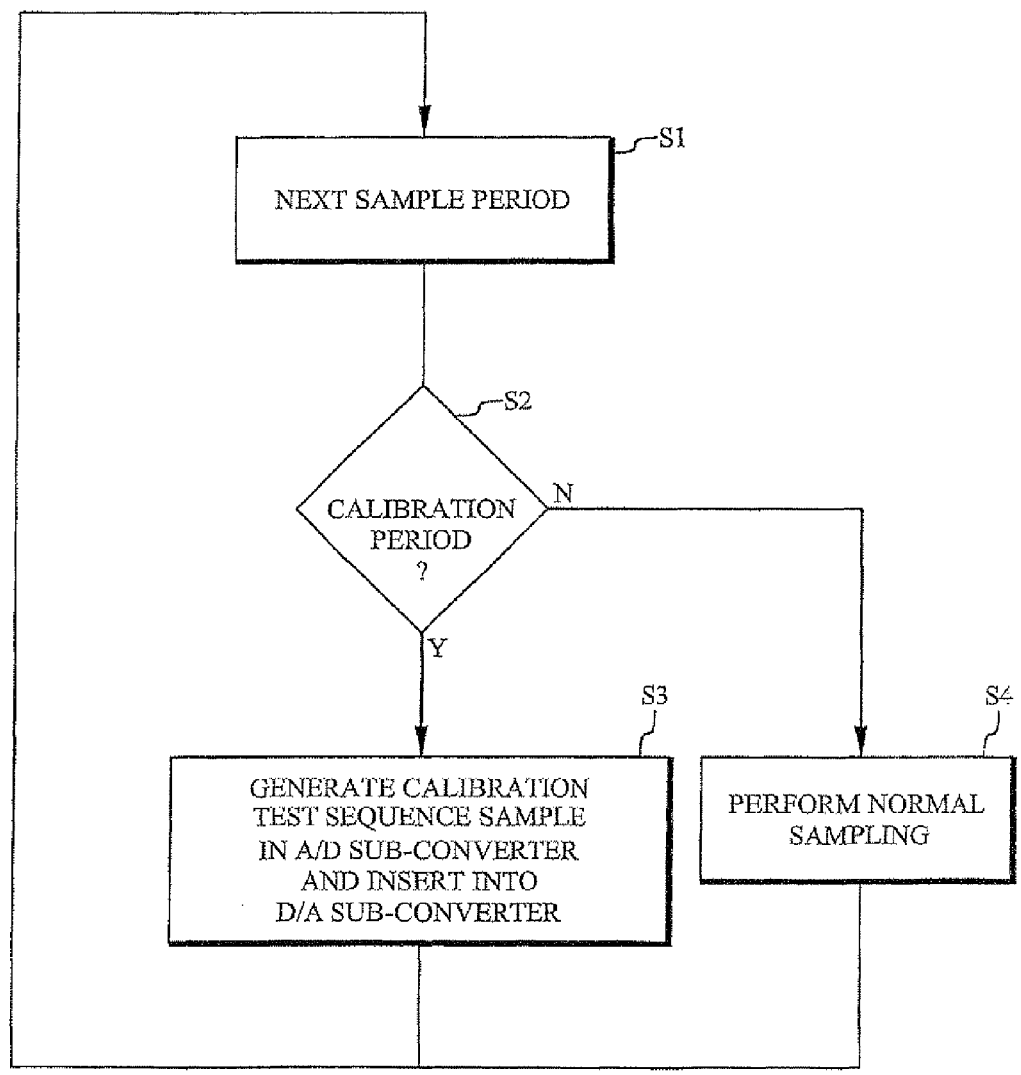
FIG. 23 is a flow chart illustrating the method of the present invention.

FIG. 23 is a flow chart that summarizes the method of the present invention. In step S1 the next sampling period is reached. Step S2 tests whether this is a normal sampling period or a calibration period. If it is a calibration period, step S3 generates a calibration test sequence sample in the A/D sub-converter for insertion into the D/A sub-converter. Otherwise normal sampling is performed in step S4. Finally the procedure returns to step S1.

It Will be understood by those skilled in the art that various modifications and changes may be made to the present invention without departure from the scope thereof, which is defined by the appended claims.

REFERENCE

[1] Song-Ung Kwak & Bang-Sup Song, "A 15-b, 5M sample/s Low-Spurious CMOS ADC", IEEE Journal of Solid-State Circuits, Vol. 32, No. 12, December 1997.

The invention claimed is:

1. An A/D converter stage comprising:
   a D/A sub-converter;
   an A/D sub-converter comprising comparators and connected to the D/A sub-converter; and
   means for modifying comparator thresholds of the comparators of the A/D sub-converter for generating and inserting a calibration test sequence into the D/A sub-converter.

2. An A/D converter stage comprising:
   a D/A sub-converter
   an A/D sub-converter comprising comparators and connected to the D/A sub-converter; and
   means for modifying comparator input signals to the comparators of the A/D sub-converter for generating and inserting a calibration test sequence into the D/A sub-converter.

3. An A/D converter stage comprising:
   a D/A sub-converter;
   an A/D sub-converter comprising comparators and connected to the D/A sub-converter; and
   means for modifying comparator offset adjustments of the comparators of the A/D sub-converter for generating and inserting a calibration test sequence into the D/A sub-converter.

4. An A/D converter comprising:
   an A/D sub-converter comprising plural comparators;
   a D/A sub-converter connected to output terminals of the plural comparators;
   a calibration test sequence generator for generating a calibration test sequence;
   a control switch configured to control application of the calibration test sequence to input terminals of the plural comparators whereby the D/A sub-converter produces a calibration sample, and wherein the control switch is configured to modify at least one of the following for generating said calibration test sequence: comparator thresholds; comparator input signals; and comparator offset adjustments.

* * * * *

UNITED STATES PATENT AND TRADEMARK OFFICE
CERTIFICATE OF CORRECTION

PATENT NO. : 7,405,681 B2  Page 1 of 1
APPLICATION NO. : 10/468234
DATED : July 29, 2008
INVENTOR(S) : Jonsson et al.

It is certified that error appears in the above-identified patent and that said Letters Patent is hereby corrected as shown below:

In Column 1, Line 5, delete "PCT/SEO2/00220" and insert -- PCT/SE02/00220 --, therefor.

In Column 2, Lines 11-12, delete "This object is achieved in accordance with the attached claims.".

In Column 5, Line 29, delete "may" and insert -- may also --, therefor.

Signed and Sealed this

Twenty-first Day of April, 2009

JOHN DOLL
*Acting Director of the United States Patent and Trademark Office*